(12) United States Patent
Ibaraki et al.

(10) Patent No.: US 6,616,467 B2
(45) Date of Patent: Sep. 9, 2003

(54) FOLDING-TYPE ELECTRONIC APPARATUS COMPRISING TWO BASE MEMBERS HINGE-CONNECTED BY A HINGE CONNECTOR WITH AN FPC

(75) Inventors: Kazuaki Ibaraki, Higashimurayama (JP); Mamoru Suzuki, Akishima (JP); Noriyuki Konishi, Chiba (JP); Masao Higuchi, Akishima (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 10/025,031

(22) Filed: Dec. 19, 2001

(65) Prior Publication Data

US 2002/0076960 A1 Jun. 20, 2002

(30) Foreign Application Priority Data

Dec. 20, 2000 (JP) .......................... 2000-387611
Jul. 5, 2001 (JP) .......................... 2001-205266
Sep. 25, 2001 (JP) .......................... 2001-291904

(51) Int. Cl.[7] ............................................. H01R 3/00
(52) U.S. Cl. ................................. 439/165; 379/433.13
(58) Field of Search ............................... 439/165, 164, 439/162, 31; 379/433.11, 433.13

(56) References Cited

U.S. PATENT DOCUMENTS

| | | | |
|---|---|---|---|
| 4,825,395 A | | 4/1989 | Kinser, Jr. et al. |
| 5,106,316 A | * | 4/1992 | Bannai et al. ............... 439/164 |
| 5,681,176 A | * | 10/1997 | Ibaraki et al. ............... 439/165 |
| 5,995,373 A | * | 11/1999 | Nagai ......................... 361/755 |

FOREIGN PATENT DOCUMENTS

| | | | |
|---|---|---|---|
| EP | 0 671 788 | 9/1995 | |
| EP | 1 009 073 | 6/2000 | |
| GB | 2 300 670 | 11/1996 | |
| JP | 2729581 | 12/1997 | ........... H01R/35/04 |
| JP | 2926212 | 5/1999 | ........... H01R/35/04 |

* cited by examiner

*Primary Examiner*—Ross Gushi
(74) *Attorney, Agent, or Firm*—Michael Best & Friedrich LLC

(57) ABSTRACT

In a folding-type electronic apparatus in which first and second base members (81, 83) are connected by a hinge element (11) to be rotatable around a predetermined axis with respect to each other, the hinge element has a receptacle portion for receiving a flexible conductor element (41). An end of the flexible conductor element is connected to a first electric element mounted on the first base member. Another end of the flexible conductor element is connected to a second electric element mounted oh the second base member. The flexible conductor has an intermediate portion located between the ends thereof and received in the receptacle portion of the hinge element.

32 Claims, 21 Drawing Sheets

PREVIOUS TECHNIQUE

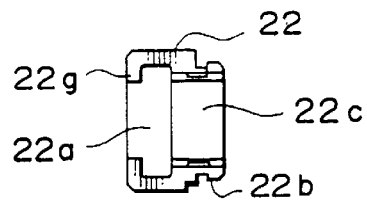
FIG. 6A
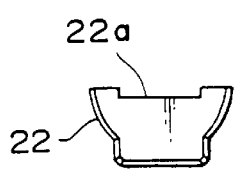     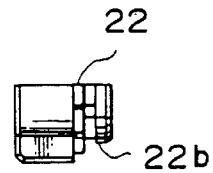     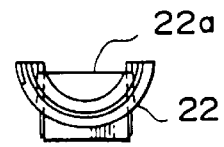
FIG. 6C      FIG. 6B      FIG. 6D
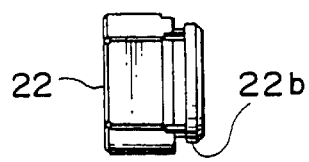
FIG. 6E

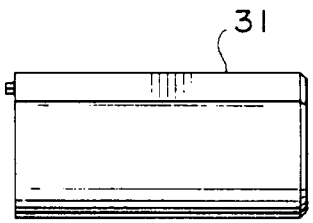
FIG. 7A
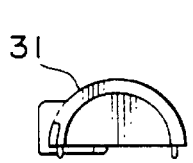 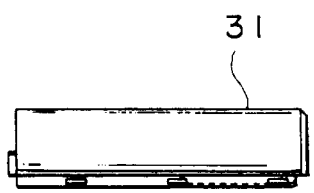 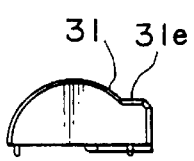
FIG. 7C   FIG. 7B   FIG. 7D
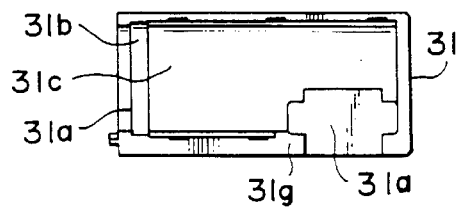
FIG. 7E

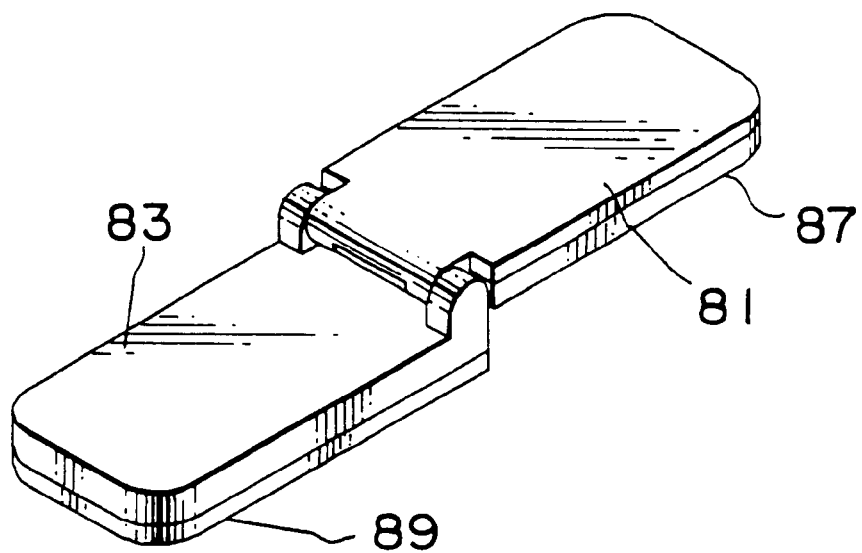
F I G. 26

FOLDING-TYPE ELECTRONIC APPARATUS COMPRISING TWO BASE MEMBERS HINGE-CONNECTED BY A HINGE CONNECTOR WITH AN FPC

BACKGROUND OF THE INVENTION

This invention relates to an electronic apparatus, such as a mobile telephone apparatus, a PDA (Personal Digital Assistant), and a notebook-type personal computer, having a folding function, and to a hinge portion or mechanism for providing the folding function to the electronic apparatus.

As an electronic apparatus of the type, a folding-type mobile telephone apparatus illustrated in FIG. 1 comprises a keyboard-side casing 101 with a keyboard mounted thereon, a board 103 mounted to the keyboard-side casing 101, an LCD-side casing 105 provided with an LCD mounted thereon and hinge-connected to the keyboard-side casing 101, a board 107 mounted to the LCD-side casing 105, and a flexible printed circuit (FPC) 109 as a flexible conductor element electrically connecting the boards 103 and 107 to each other. The FPC 109 has a first and a second end and an intermediate portion therebetween. The first end of the FPC 109 is connected to a connector 110 mounted on the board 103. The second end of the FPC 109 is connected to a connector (not shown) mounted on the board 107. The intermediate portion of the FPC 109 is unneatly arranged without any special care in the vicinity of a hinge portion 111 between the keyboard-side casing 101 and the LCD-side casing 105.

The mobile telephone apparatus illustrated in FIG. 1 is disadvantageous in the following respect. Every time when a folding operation is repeated, the FPC 109 is subjected to a stress. Such stress may result in disconnection of the FPC 109 from the connector 110 or interruption of a conductor in the FPC 109.

In addition, there is a problem in appearance that the FPC 109 unneatly arranged around the hinge portion 111 can be seen through a gap between the casings 101 and 105. Since the FPC 109 must be arranged in the vicinity of the hinge portion 111, assembling of the apparatus is difficult.

Japanese Patent Publication (B) No. 2729581 or 2926212 discloses an electronic apparatus comprising two casings hinge-connected by a hinge portion and a cylindrical element called a hinge connector arranged adjacent to the hinge portion. The FPC is incorporated into the cylindrical element. However, due to mounting error and dimensional tolerance of various elements, the cylindrical element may not be incorporated to the electronic apparatus or the hinge portion may be subjected to a stress after incorporating the cylindrical element.

SUMMARY OF THE INVENTION

It is therefore an object of this invention to provide a folding-type electronic apparatus which is resistant against repetition of a folding operation, excellent in appearance, easy in assembling, and suppressed in possibility of occurrence of a stress in a hinge portion after assembling.

It is another object of this invention to provide a hinge connector which is usable in the electronic apparatus.

Other objects of the present invention will become clear as the description proceeds.

According to an aspect of the present invention, there is provided a hinge connector for use in an electronic apparatus which comprises first and second base members for mounting first and second electric elements, respectively. The hinge connector comprises a hinge element having a receptacle portion and connecting the first and the second base members so that the first and the second base members are rotatable around a predetermined axis with respect to each other. The hinge connector further comprises a flexible conductor element for electrically connecting the first and the second electric elements to each other. The flexible conductor element has both end portions adapted to be connected to the first and the second electric elements, respectively, and an intermediate portion located between the both end portions and received in the receptacle portion of the hinge element.

According to another aspect of the present invention, there is provided an electronic apparatus which comprises a first base member for mounting a first electric element, a second base member for mounting a second electric element, a hinge element having a receptacle portion and for connecting the first and the second base members so that the first and the second base members are rotatable around a predetermined axis with respect to each other, and a flexible conductor element electrically connecting the first and the second electric elements to each other. The flexible conductor element has both end portions connected to the first and the second electric elements, respectively, and an intermediate portion located between the both end portions and received in the receptacle portion of the hinge element.

BRIEF DESCRIPTION OF THE DRAWINGS

FIG. 6A is a plan view of a lower split portion of the first member;

FIG. 6B is a front view of the lower split portion of the first member;

FIG. 6C is a left side view of the lower split portion of the first member;

FIG. 6D is a right side view of the lower split portion of the first member;

FIG. 6E is a bottom view of the lower split portion of the first member;

FIG. 7A is a plan view of an upper split portion of a second member contained in the hinge member illustrated in FIGS. 2A and 2B;

FIG. 7B is a front view of the upper split portion of the second member;

FIG. 7C is a left side view of the upper split portion of the second member;

FIG. 7D is a right side view of the upper split portion of the second member;

FIG. 7E is a bottom view of the upper split portion of the second member;

FIGS. 25 and 26 are perspective views of a modification of the electronic apparatus.

DESCRIPTION OF THE PREFERRED EMBODIMENTS

Figure 1:
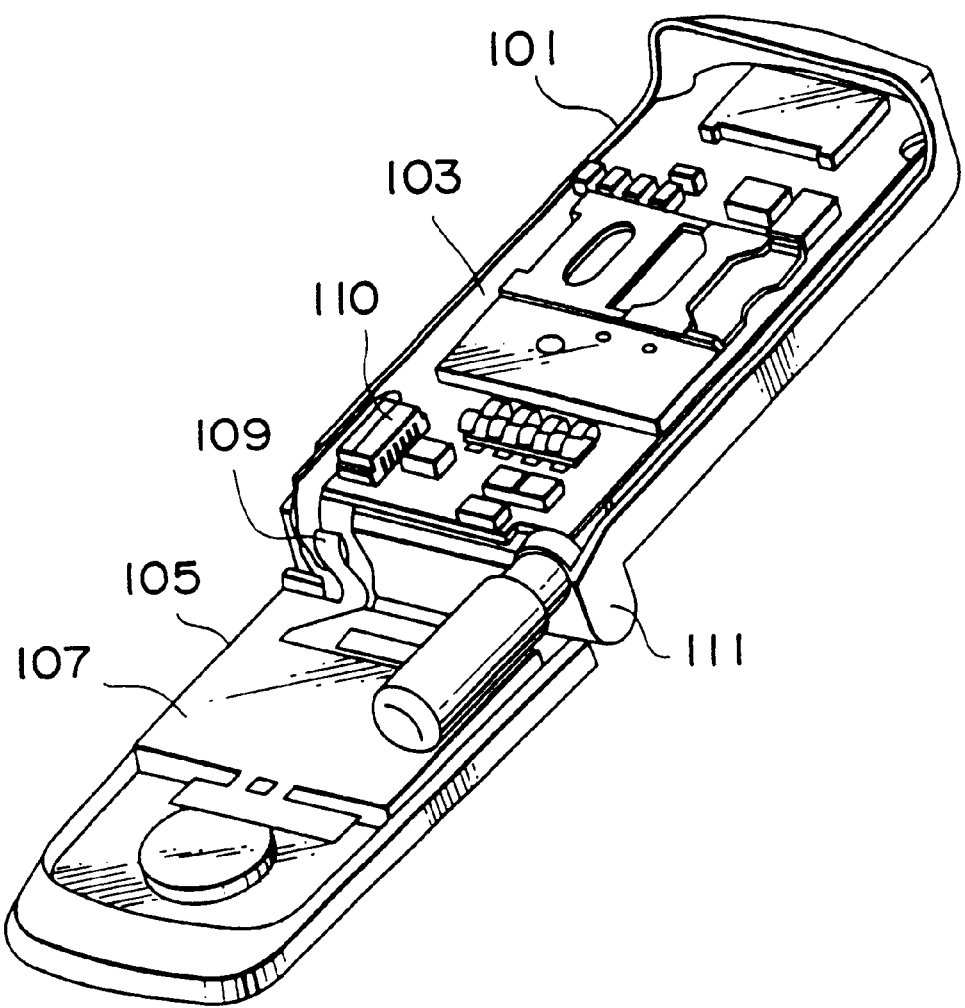
FIG. 1 is a perspective view of a conventional folding-type mobile telephone apparatus in a previous technique with an outer cover removed therefrom.

Referring to FIGS. 2A through 2D and 3, description will at first be made of a hinge member or element used in an electronic apparatus according to a first embodiment of this invention. The hinge member illustrated in FIGS. 2A through 2D and 3 is depicted by a reference numeral 11 and comprises a first member 200 of a generally cylindrical or tubular shape and a second member 300 of a generally cylindrical or tubular shape connected to the first member 200 in an axial direction. The first member 200 comprises an upper split portion 21 of a generally semicylindrical shape and a lower split portion 22 of a generally semicylindrical shape coupled to each other to form the generally cylindrical shape. Likewise, the second member 300 comprises an upper split portion 31 of a semicylindrical shape and a lower split portion 32 of a semicylindrical shape coupled to each other to form the generally cylindrical shape. Thus, each of the first and the second members 200 and 300 is split into two portions along a plane containing a center axis and is formed by resin molding. The hinge member 11 comprises a combination of a plurality of elements as described above and may therefore be called a hinge assembly.

The first member 200 has an axial length shorter than that of the second member 300. The first member 200 has an outer peripheral surface of a generally cylindrical shape. Likewise, the second member 300 has an outer peripheral surface of a generally cylindrical shape.

Referring to FIGS. 4A through 4F in addition, the description will be directed to a hinge connector comprising the hinge member 11 and an FPC 41 assembled to the hinge member 11.

Inside the hinge member 11, a space is defined to serve as a receptacle portion. To the hinge member 11, the FPC 41 as a flexible conductor element is coupled with its intermediate portion received in the receptacle portion.

The FPC 41 has one end with a first connector 43 mounted thereon. The first connector 43 is electrically connected to a circuit of the FPC 41. The FPC 41 has the other end with a second connector 44 mounted thereon. The second connector 44 is electrically connected to another circuit of the FPC 41. Reference numerals 41e represent terminal portions of the second connector 44 while reference numerals 41f represent terminal portions of the first connector 43.

The first connector 43 is removably connected to a first mating connector 51a mounted on a first board 55a. The second connector 44 is removably connected to a second mating connector 51b mounted on a second board 55b. On the both ends of the FPC 41, board connectors may be mounted depending upon the type of the mating connectors.

The hinge member 11 clamps and holds a pair of first engaging portions 41a and a pair of second engaging portions 42a of the FPC 41. The intermediate portion of the FPC 41 is wound or twisted in a spiral fashion at least in a single turn and is arranged inside the hinge member 11. The both ends of the FPC 41 are led out from the hinge member 11.

The hinge member 11 will be described more in detail.

Figure 5A:
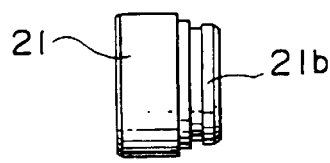
FIG. 5A is a plan view of an upper split portion of a first member contained in the hinge member illustrated in FIGS. 2A and 2B.
Figure 5C:
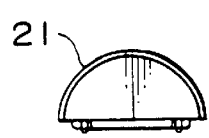
FIG. 5C is a left side view of the upper split portion of the first member.
Figure 5B:
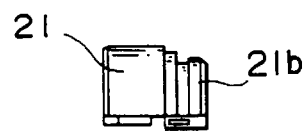
FIG. 5B is a front view of the upper split portion of the first member.
Figure 5D:
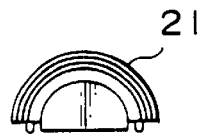
FIG. 5D is a right side view of the upper split portion of the first member.
Figure 5E:
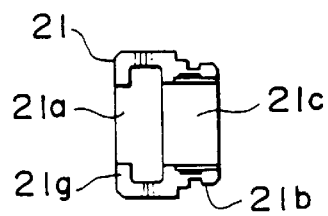
FIG. 5E is a bottom view of the upper split portion of the first member.
Figure 8A:
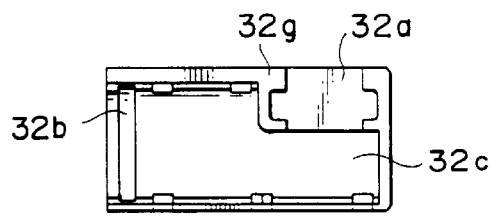
FIG. 8A is a plan view of a lower split portion of the second member.
Figure 8C:
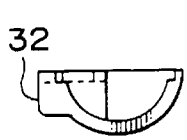
FIG. 8C is a left side view of the lower split portion of the second member.
Figure 8B:
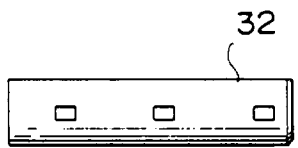
FIG. 8B is a front view of the lower split portion of the second member.
Figure 8D:
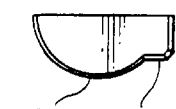
FIG. 8D is a right side view of the lower split portion of the second member.
Figure 8E:
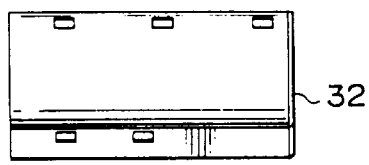
FIG. 8E is a bottom view of the lower split portion of the second member.

As illustrated in FIGS. 5A though 5E also, the upper split portion 21 of the first member 200 has an upper holding part 21a having a flat surface to hold the first engaging portions 41a of the FPC 41. The upper holding part 21a is slightly depressed from a coupling surface or plane to be coupled to the lower split portion 22 of the first member 200. Furthermore, the upper split portion 21 of the first member 200 has an upper rotation guide 21b of a semicircular shape rotatably engaged with the second member 300, and an upper receptacle portion 21c for receiving the intermediate portion of the FPC 41.

As illustrated in FIGS. 6A through 6E also, the lower split portion 22 of the first member 200 has a lower holding part 22a having a flat surface to hold the first engaging portions 41a of the FPC 41. The lower holding part 22a is slightly depressed from a coupling surface or plane to be coupled to the upper split portion 21 of the first member 200. Furthermore, the lower split portion 22 of the first member 200 has a lower rotation guide 22b of a semicircular shape rotatably engaged with the second member 300, and a lower receptacle portion 22c for receiving the intermediate portion of the FPC 41.

As illustrated in FIGS. 7A though 7E also, the upper split portion 31 of the second member 300 has an upper holding part 31a having a flat surface to hold the second engaging portions 42a of the FPC 41. The upper holding part 31a is slightly depressed from a coupling surface or plane to be coupled to the lower split portion 32 of the second member 300. Furthermore, the upper split portion 31 of the second member 300 has an upper rotation guide 31b of a semicircular shape rotatably engaged with the first member 200, and an upper receptacle portion 31c for receiving the intermediate portion of the FPC 41. In addition, the upper split portion 31 has a protruding portion 31e slightly protruding outward from the outer peripheral surface of the second member 300.

As illustrated in FIGS. 8A through 8E also, the lower split portion 32 of the second member 300 has a lower rotation guide 32b of a semicircular shape rotatably engaged with the first member 200, and a lower receptacle portion 32c for receiving the intermediate portion of the FPC 41. Furthermore, the lower split portion 32 of the second member 300 has a lower holding part 32a having a flat surface to hold the second engaging portions 42a of the FPC 41. The lower holding part 32a is slightly depressed from a coupling surface or plane to be coupled to the upper split portion 31 of the second member 300. In addition, the lower split portion 32 has a protruding portion 32e slightly protruding outward from the outer peripheral surface of the second member 300 in parallel to the protruding portion 31e of the upper split portion 31.

A combination of the upper receptacle portions 21c and 31c and the lower receptacle portions 22c and 32c will be called a receptacle arrangement for receiving the intermediate portion of the FPC 41.

A combination of the upper rotation guide 21b and the lower rotation guide 22b of the first member 200 forms a first guide of a ring shape. Likewise, a combination of the upper rotation guide 31b and the lower rotation guide 32b of the second member 300 forms a second guide of a ring shape. When the first guide is fitted inside the second guide, the first and the second members 200 and 300 are coupled to each other to be rotatable with respect to each other.

The upper holding part 21a and the lower holding part 22a of the first member 200 are formed so that the first engaging portions 41a of the FPC 41 are received therebetween. Likewise, the upper holding part 31a and the lower holding part 32a of the second member 300 are formed so that the first engaging portions 41a of the FPC 41 are clamped between the upper and the lower holding parts 21a and 22a of the first member 200 to be engaged and held. Likewise, the second engaging portions 42a of the FPC 41 are clamped between the upper and the lower holding parts 31a and 32a of the second member 300 to be engaged and held.

One of the both ends of the FPC 41 is led out from a position between the upper and the lower holding parts 21a and 22a of the first member 200 through an opening formed in first closing end walls 21g and 22g formed at one end of the first member 200 opposite to the other end adjacent to the second member 300, and extends in an axial direction. In the opening formed in the first closing end walls 21g and 22g, a gap around the FPC 41 is sealed by a sealing member such as resin or an adhesive.

The other end of the FPC 41 is led out from a position between the upper and the lower holding parts 31a and 32a of the second member 300 through an opening formed in second closing side walls 31g and 32g of the second member 300 formed at one end of the second member 300 opposite to the other end adjacent to the first member 200, and extend at first in a radially outward direction. In the opening formed in the second closing side walls 31g and 32g, a gap around the FPC 41 is sealed by a sealing member such as resin or an adhesive. Outside the hinge member 11, the FPC 41 is turned to extend in the axial direction.

Referring to FIGS. 9 through 12, description will be made of the electronic apparatus having a folding function and comprising the above-mentioned hinge member 11. The electronic apparatus may have a function basically equivalent to that of the mobile telephone apparatus illustrated in FIG. 1.

Figure 9:
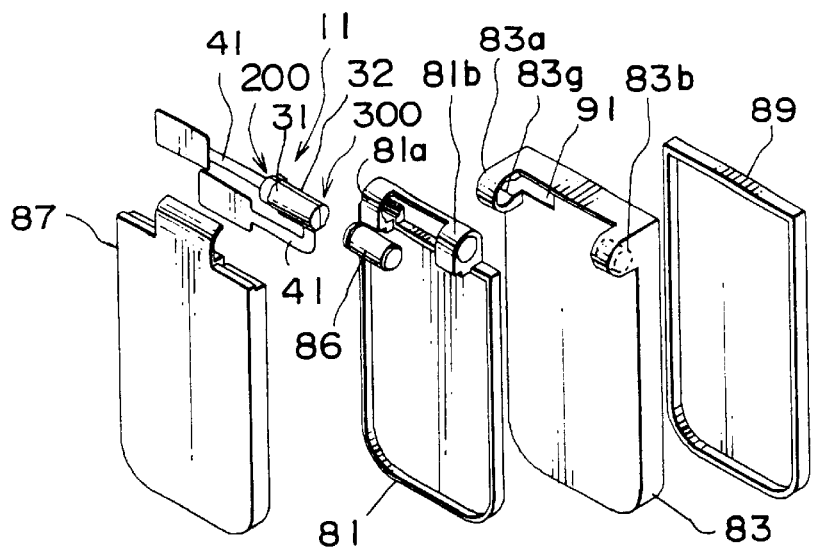
FIG. 9 is an exploded perspective view of the electronic apparatus.

At first referring to FIG. 9, the electronic apparatus comprises a first base member 81, a second base member 83, a first cover member 87, and a second cover member 89. The first base member 81 mounts an LCD-side board (not shown) facing the first cover member 87. The LCD-side board corresponds to the first board depicted by the reference numeral 55a in FIG. 2A and has a first mating connector.

The second base member 83 mounts a keyboard-side board (not shown) facing the second cover member 89. The keyboard-side board corresponds to the second board depicted by the reference numeral 55b in FIG. 2A and has a second mating connector.

The first base member 81 has a pair of hinge portions 81a and 81b spaced from each other in a predetermined direction. The second base member 83 has a pair of hinge portions 83a and 83b spaced from each other in the predetermined direction. The first and the second base members 81 and 83 are coupled to each other in a manner such that the hinge portions 81a and 81b are inserted inside the hinge portions 83a and 83b. Upon coupling, the hinge portions 81a, 81b, 83a, and 83b are aligned along a predetermined axis extending in the predetermined direction.

Figure 10:
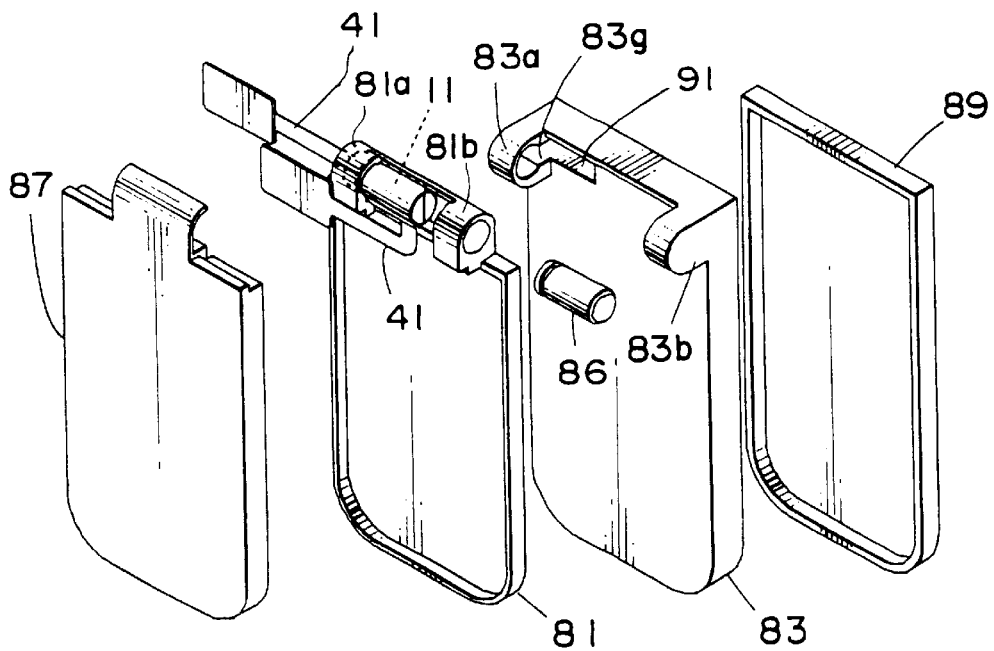
FIG. 10 is an exploded perspective view of the electronic apparatus in which the hinge member is assembled to a first base member of the electronic apparatus.
Figure 11:
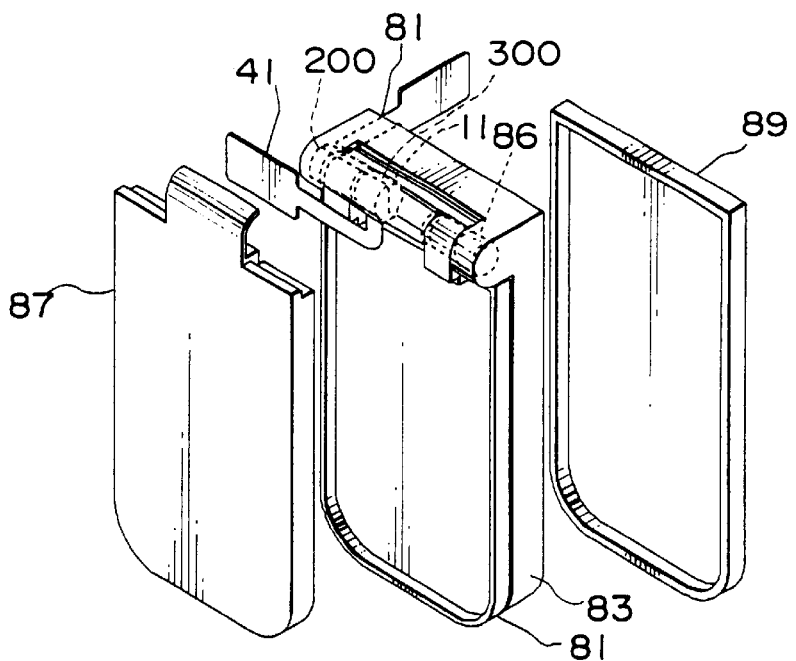
FIG. 11 is an exploded perspective view of the electronic apparatus in which the first base member is assembled to a second base member of the electronic apparatus.

As illustrated in FIGS. 10 and 11, the hinge portions 81a, 81b, 83a, and 83b are coupled to be rotatable with respect to each other by the use of the hinge member 11 and a damper hinge 86. The damper hinge 86 is fitted into holes formed in the hinge portions 81b and 83b to hinge-connect the hinge portions 81b and 83b.

The hinge member 11 is fitted into holes formed in the hinge portions 81a and 83a to hinge-connect the hinge portions 81a and 83a. When fitted into the holes of the hinge portions 81a and 83a, the hinge portion 11 is formed by a combination of the above-mentioned elements with the FPC 41 coupled thereto. After the FPC 41 is coupled, the first and the second members 200 and 300 are rotated with respect to each other. Then, the intermediate portion of the FPC 41 is easily wound or twisted in a spiral fashion within the hinge member 11.

Herein, the first member 200 is fitted into the hole of the hinge portion 83a of the second base member 83 while the second member 300 is fitted into the hole of the hinge portion 81a of the first base member 81. The hinge member 11 is removably held by the hinge portions 81a and 83a. In this event, the first member 200 is locked in a rotating direction to the hinge portion 83a of the first base member 83 while the second member 300 is locked in the rotating direction to the hinge portion 81a of the second base member 81.

Figure 2A:
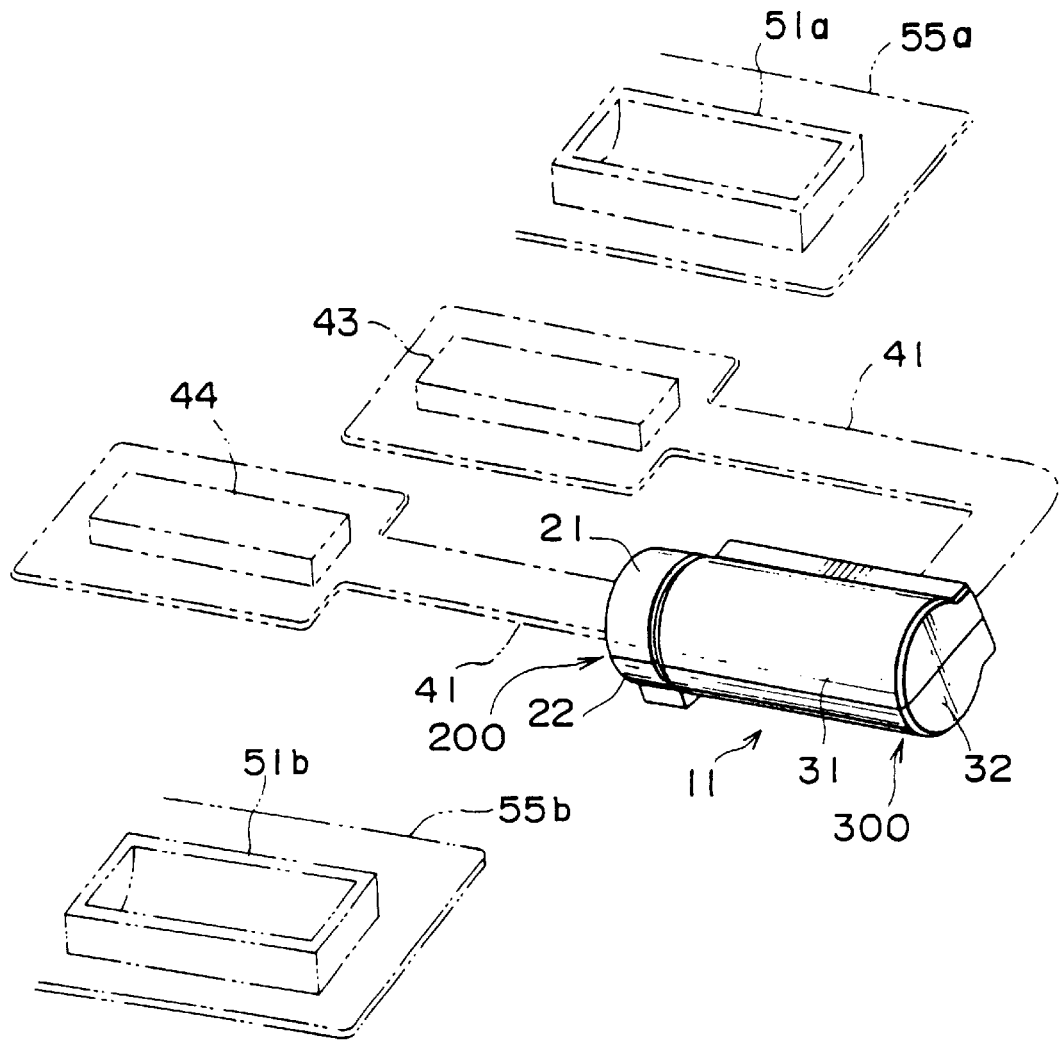
FIG. 2A is a perspective view of a hinge member used in an electronic apparatus according to a first embodiment of this invention.
Figure 2D:
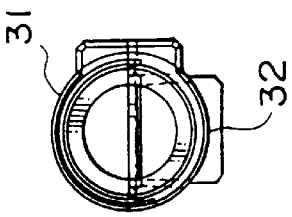
FIG. 2D is a right side view of the hinge member.
Figure 2B:
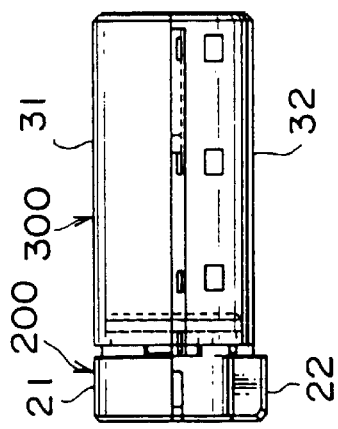
FIG. 2B is a front view of the hinge member illustrated in FIG. 2A.
Figure 2C:
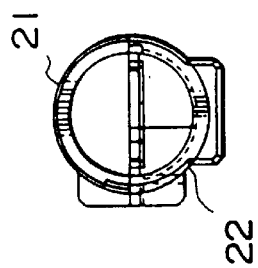
FIG. 2C is a left side view of the hinge member.
Figure 3:
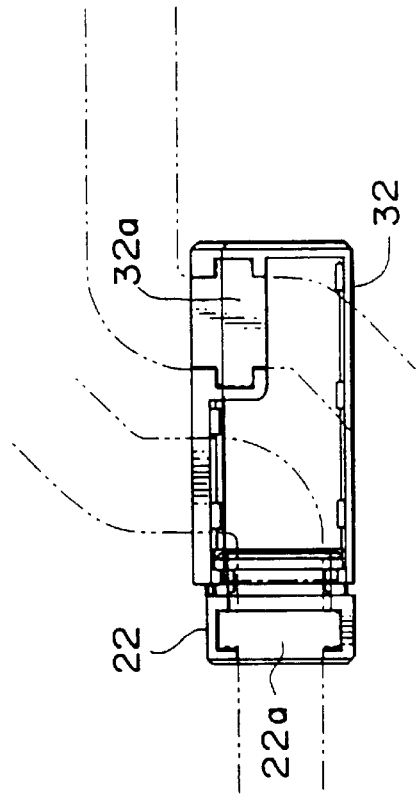
FIG. 3 shows, together with an FPC illustrated by an imaginary line, a plan view of a lower split portion of the hinge member illustrated in FIG. 2A.
Figure 4A:
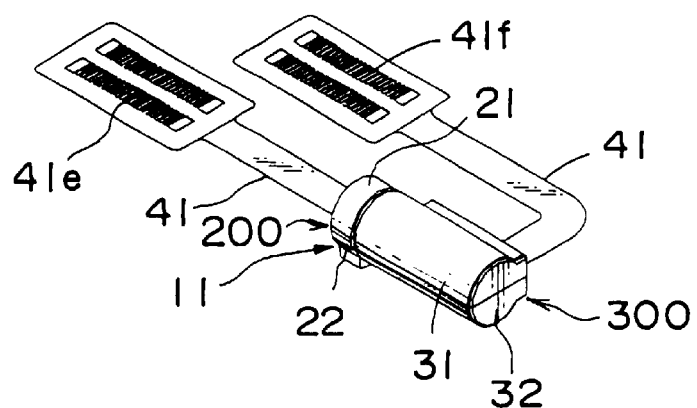
FIG. 4A is a perspective view of a hinge connector comprising the FPC and the hinge member illustrated in FIG. 2A.
Figure 4B:
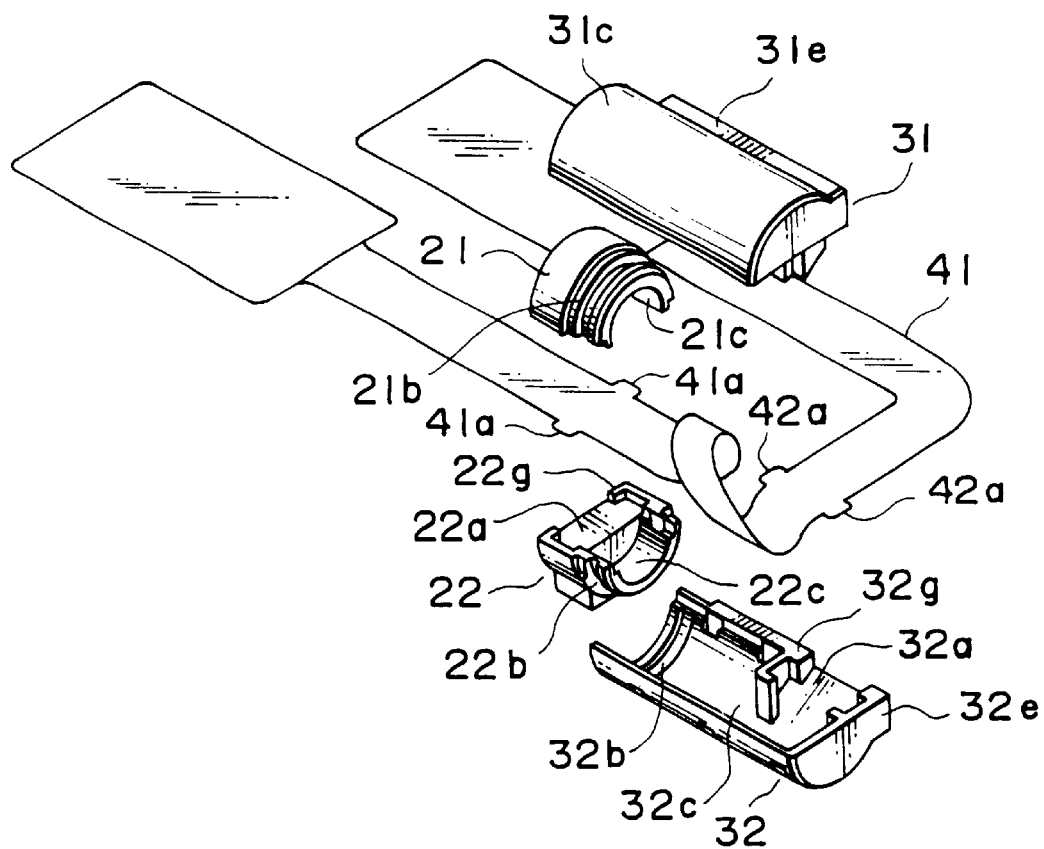
FIG. 4B is an exploded perspective view of the hinge connector of FIG. 4A.
Figure 4C:
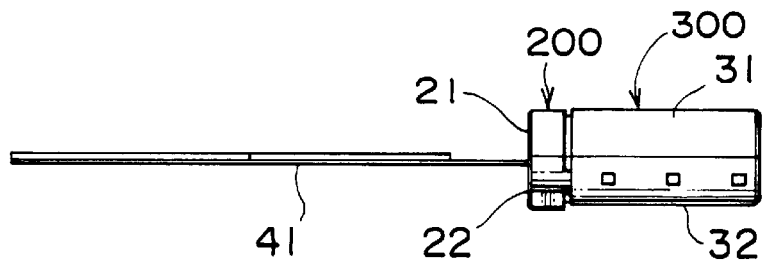
FIG. 4C is a front view of the hinge connector.
Figure 4D:
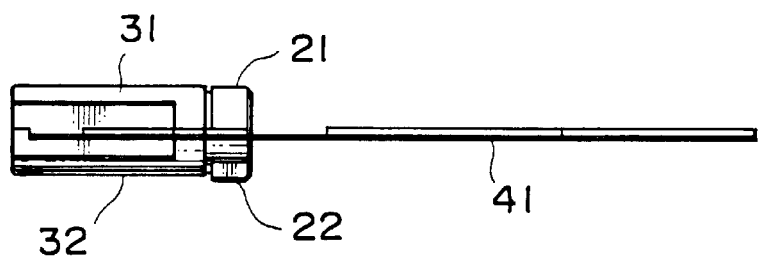
FIG. 4D is a rear view of the hinge connector.
Figure 4E:
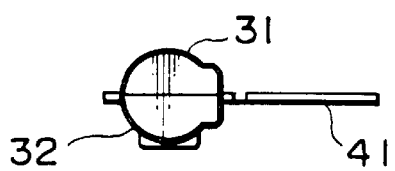
FIG. 4E is a right side view of the hinge connector.
Figure 4F:
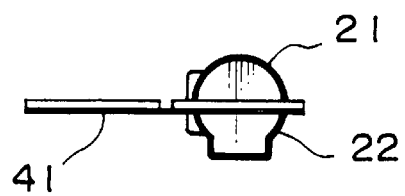
FIG. 4F is a left side view of the hinge connector.

After the hinge member 11 is fitted, the one end of the FPC 41 is led out from the second member 300 and is then turned back so that the first connector 43 illustrated in FIG. 2A is connected to the above-mentioned first mating connector. The other end of the FPC 41 is led out from the first member 200 to pass through a through hole, shown by a reference numeral 91 in FIGS. 9 and 10, formed in the second base member 83 so that the second connector 44 illustrated in FIG. 2A is connected to the above-mentioned second mating connector.

Figure 12:
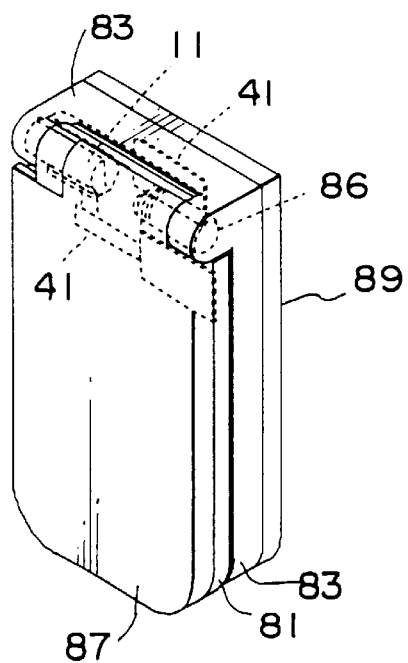
FIG. 12 is a perspective view of the electronic apparatus in which a cover is closed.
Figure 13:
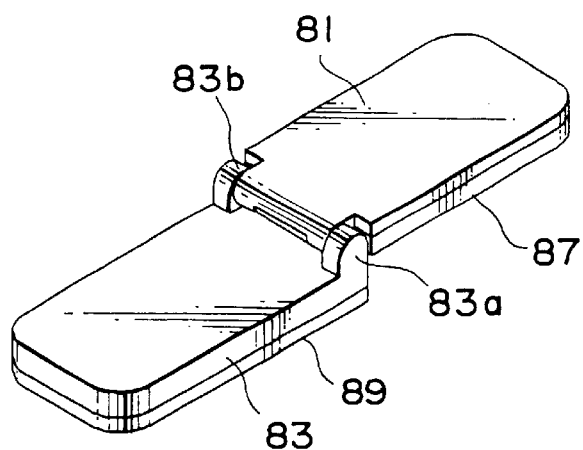
FIG. 13 is a perspective view of the electronic apparatus in which the cover is opened.

Referring to FIGS. 12 and 13 in addition, the first cover member 87 is attached to the first base member 81 while the second cover member 89 is attached to the second base member 83. Thus, a mobile telephone apparatus is assembled as an example of the electronic apparatus.

Figure 14:
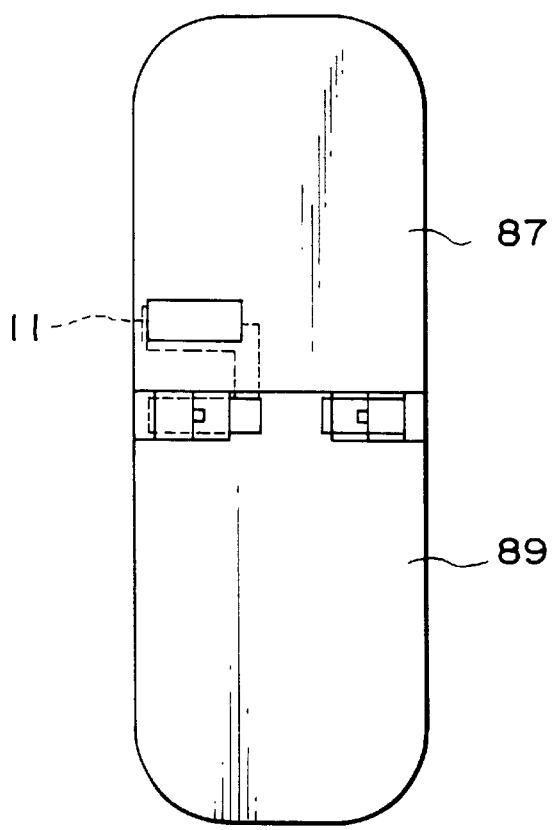
FIG. 14 is a rear view of the electronic apparatus illustrated in FIG. 13.
Figure 15:
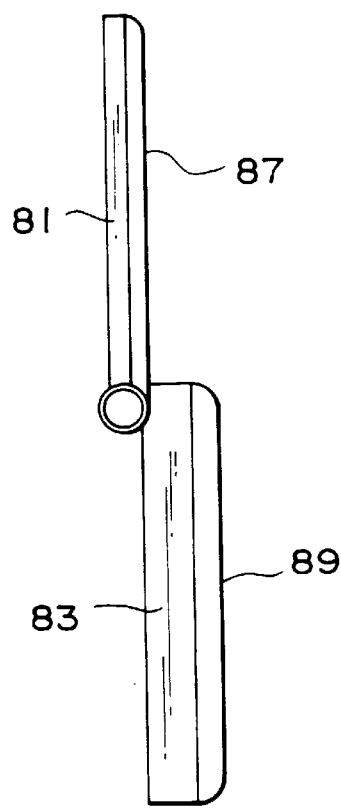
FIG. 15 is a side view of the electronic apparatus illustrated in FIG. 13.

The mobile telephone apparatus illustrated in FIG. 12 is in a closed state, i.e., in a folded state in which the first base member 81 with the first cover member 87 is put on the second base member 83 with the second cover member 89. Alternatively, the mobile telephone apparatus can be put into an opened state by rotating the first base member 81 with the first cover member 87 with respect to the second base member 83 with the second cover member 89 as illustrated in FIGS. 13 through 15.

Figure 16:
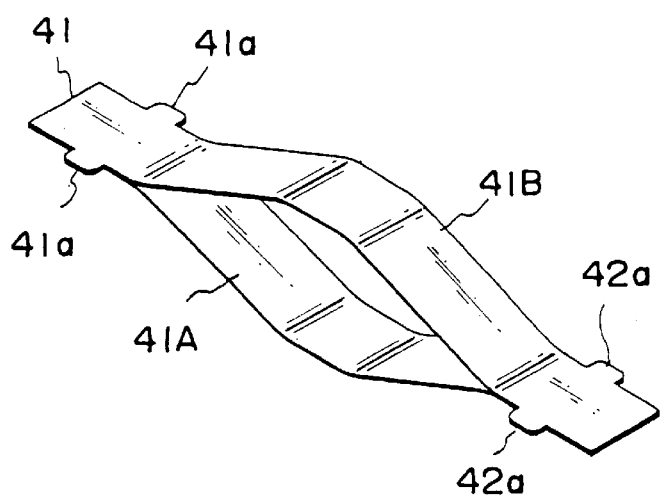
FIG. 16 is a perspective view of another FPC usable in the hinge connector of FIG. 2A.

Referring to FIG. 16, description will be made of a modification of the FPC applicable to the hinge member 11 illustrated in FIGS. 2A–2D.

The FPC 41 comprises two FPC elements 41A and 41B laminated on each other. The FPC elements 41A and 41B are bonded to each other by an adhesive at least at first and second engaging portions 41a and 42a. Because the FPC 41 is wound in the spiral fashion as described above, the FPC elements 41A and 41B are differed in length between the first and the second engaging portions 41a and 42a. Specifically, the one of the FPC elements 41A and 41B to be positioned outside when the FPC 41 is wound is longer than the other positioned inside.

Figure 17:
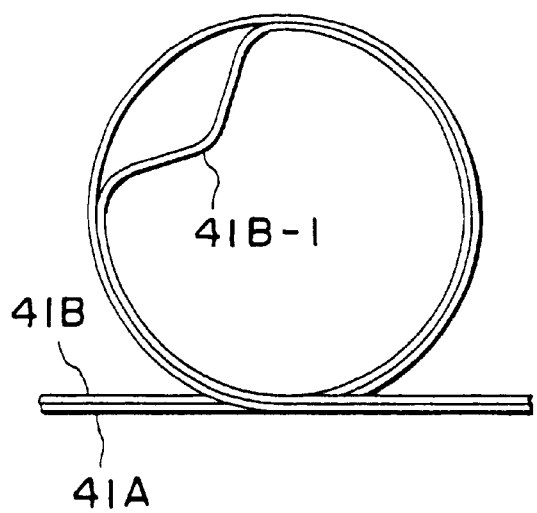
FIG. 17 is a side view of the FPC wound in a bad condition.
Figure 18:
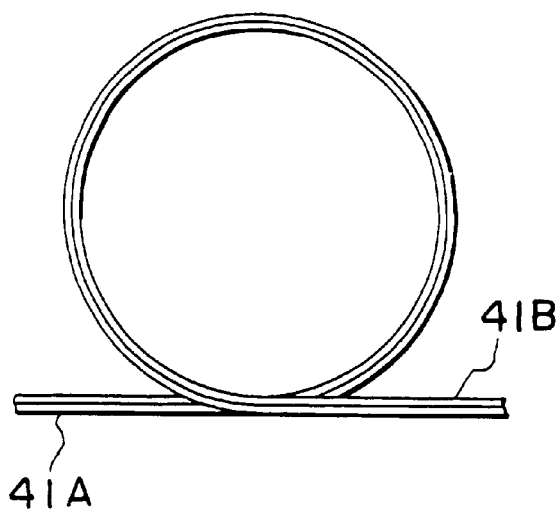
FIG. 18 is a side view of the FPC wound in a good condition.

It is assumed that the FPC elements 41A and 41B are equal in length to each other. In this case, when the FPC 41 is wound, the inner FPC 41B inevitably has a large slack 41B-1 as illustrated in FIG. 17. If the inner FPC 41B is shorter than the outer FPC 41A as described above, the FPC 41 can be wound without any slack as illustrated in FIG. 18.

As a specific example, description has been made about the two FPC elements 41A and 41B. However, it will readily be understood that the FPC may comprise three or more FPC elements.

Referring to FIGS. 19A through 19D and 20, description will be made of a hinge member or element used in an electronic apparatus according to a second embodiment of this invention.

The hinge member illustrated in FIGS. 19A through 19D and 20 is also depicted by a reference numeral 11 and comprises similar parts designated by like reference numerals. The first and the second members 200 and 300 are coupled to each other to be rotatable around a common center axis in the axial direction with respect to each other. The hinge member 11 is combined with the FPC 41 so that the intermediate portion of the FPC 41 is introduced into the interior of the first and the second members 200 and 300. A combination of the hinge member 11 and the FPC 41 forms the hinge connector.

The FPC 41 can be replaced by a flexible flat cable (FFC). Therefore, the FPC 41 and the FFC may collectively be called a flat cable.

The first member 200 has a pair of protruding portions 21e and 22e slightly protruding outward from the outer peripheral surface. In the second member 300, the protruding portions 31e and 32e are slightly protruding outward from the outer peripheral surface.

The first member 200 and the second member 300 are split into the two split portions 21 and 22 and into the two split portions 31 and 32 along a plane containing the center axis, respectively. The split portions 21, 22, 31, and 32 are formed by resin molding and coupled to one another to constitute the hinge member 11 which may be called a hinge assembly. In an assembled state, the hinge member 11 clamps the first and the second engaging portions 41a and 42a of the FPC 41.

The FPC 41 has a longitudinal intermediate portion 41g spirally wound or twisted in two turns and arranged inside the hinge member 11. The both ends of the FPC 41 are led out from the hinge member 11.

The hinge member 11 will be described more in detail.

In the split portions 21 and 22 of the first member 200, each of the rotation guides 21b and 22b has a semicircular shape. A combination of the receptacle portions 21c and 22c receives a part of the longitudinal intermediate portion 41g of the FPC 41. The upper holding part 21a is for holding the first engaging portions 41a of the FPC 41. The upper holding part 21a protrudes from a coupling surface or plane to be coupled to the split portion 22. The lower holding part 22a has a flat surface and an opening 22n to hold the first engaging portions 41a of the FPC 41. The lower holding part 22a is depressed from a coupling surface or plane to be coupled to the split portion 21.

In the split portions 31 and 32 of the second member 300, each of the rotation guides 31b and 32b has a semicircular shape. The rotation guides 31b and 32b are rotatably engaged with the rotation guides 21b and 22b. A combination of the receptacle portions 31c and 32c receives another part of the longitudinal intermediate portion 41g of the FPC 41.

In the split portion 31, the upper holding part 31a is for holding the second engaging portions 42a of the FPC 41. The upper holding part 31a protrudes from a coupling surface or plane to be coupled to the split portion 32. In the split portion 32, the lower holding part 32a has a flat surface and an opening 32n to hold the second engaging portions 42a of the FPC 41. The lower holding part 32a is depressed from a coupling surface or plane to be coupled to the split portion 31.

The holding parts 21a and 22a are complementarily coupled to each other. The holding parts 31a and 32a are complementarily coupled to each other. The holding parts 21a, 22a, 31a, and 32a make the FPC 41 led out through the openings 22n and 32n towards a rotating direction of the first and the second members 200 and 300.

A combination of the rotation guides 21b and 22b of a semicircular shape forms a first guide having an outer peripheral surface of a circular shape. Likewise, a combination of the rotation guides 31b and 32b of a semicircular shape forms a second guide having an outer peripheral surface of a circular shape. The rotation guides 21b and 22b are fitted into the rotation guides 31b and 32b so that the first and the second members 200 and 300 are rotatable with respect to each other. Instead of the holding parts 21a, 22a, 31a, and 32a, the hinge assembly may have only the holding part 22a on one split portion 22 and only the holding part 32a on one split portion 32.

The intermediate portion 41g of the FPC 41 is arranged in the receptacle portions 21c, 22c, 31c, and 32c of the split portions 21, 22, 31, and 32. The both ends of the FPC 41 are led out from the split portions 21, 22, 31, and 32. The first engaging portions 41a of the FPC 41 are clamped between the holding parts 21a and 22a of the first member 200 to be engaged and held. Likewise, the second engaging portions 42a of the FPC 41 are clamped between the holding parts 31a and 32a of the second member 300 to be engaged and held. Each of the holding parts 21a, 22a, 31a, and 32a are formed into a shape in conformity with corresponding portions of the FPC 41 including the first and the second engaging portions 41a and 42a.

One end of the FPC 41 is led out from the holding part 22a, passing through the opening 22n formed by cutting a first closing end wall 22g at the first holding part 22a, around the center axis and radially outward. At the first closing end wall 22g, a gap around the FPC 41 passing through the opening 22n is sealed by a sealing member such as resin or an adhesive.

The other end of the FPC 41 is led out from the second holding part 32a, passing through the opening 32n formed by cutting a second closing side wall 32g at the holding part 32a, around the center axis and radially outward. At the second closing side wall 32g, a gap around the FPC 41 passing through the opening 32n is sealed in the similar manner. Thus, one end and the other end of the FPC 41 extend outward from the hinge member 11 in parallel to each other. The FPC 41 is led out in a tangential direction (rotating direction) on the outer peripheral surface of the hinge member 11.

Figure 19A:
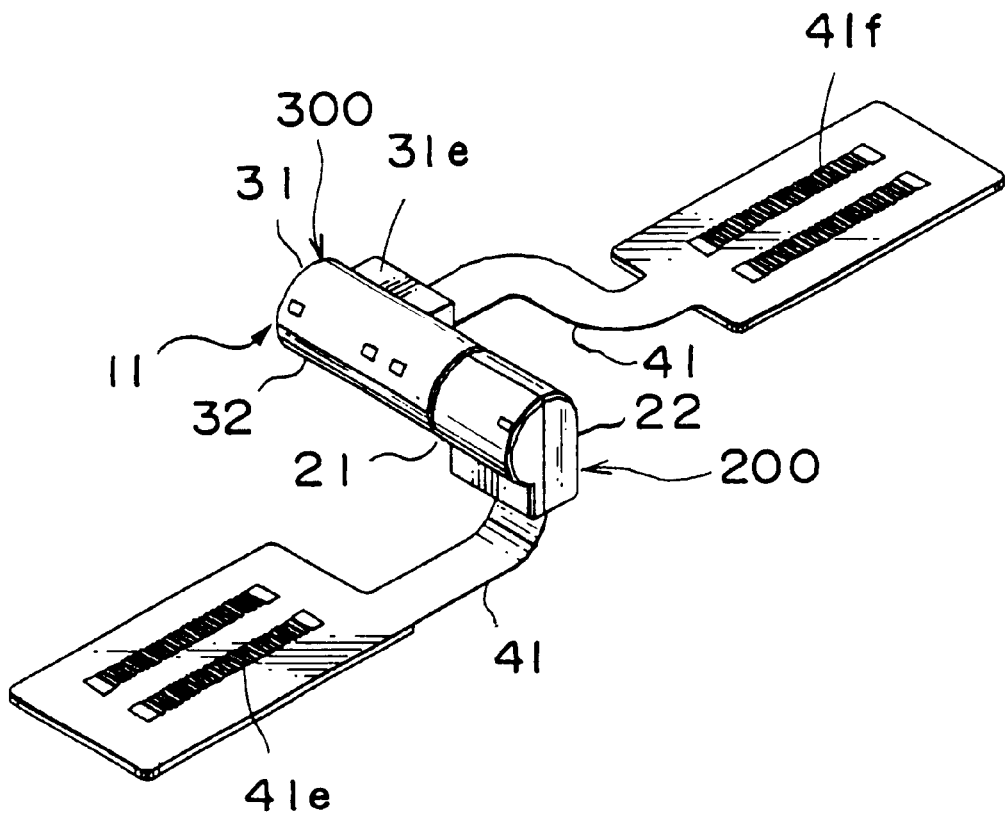
FIG. 19A is a perspective view of a hinge connector comprising an FPC and a hinge member which are used in an electronic apparatus according to a second embodiment of this invention.
Figure 19B:
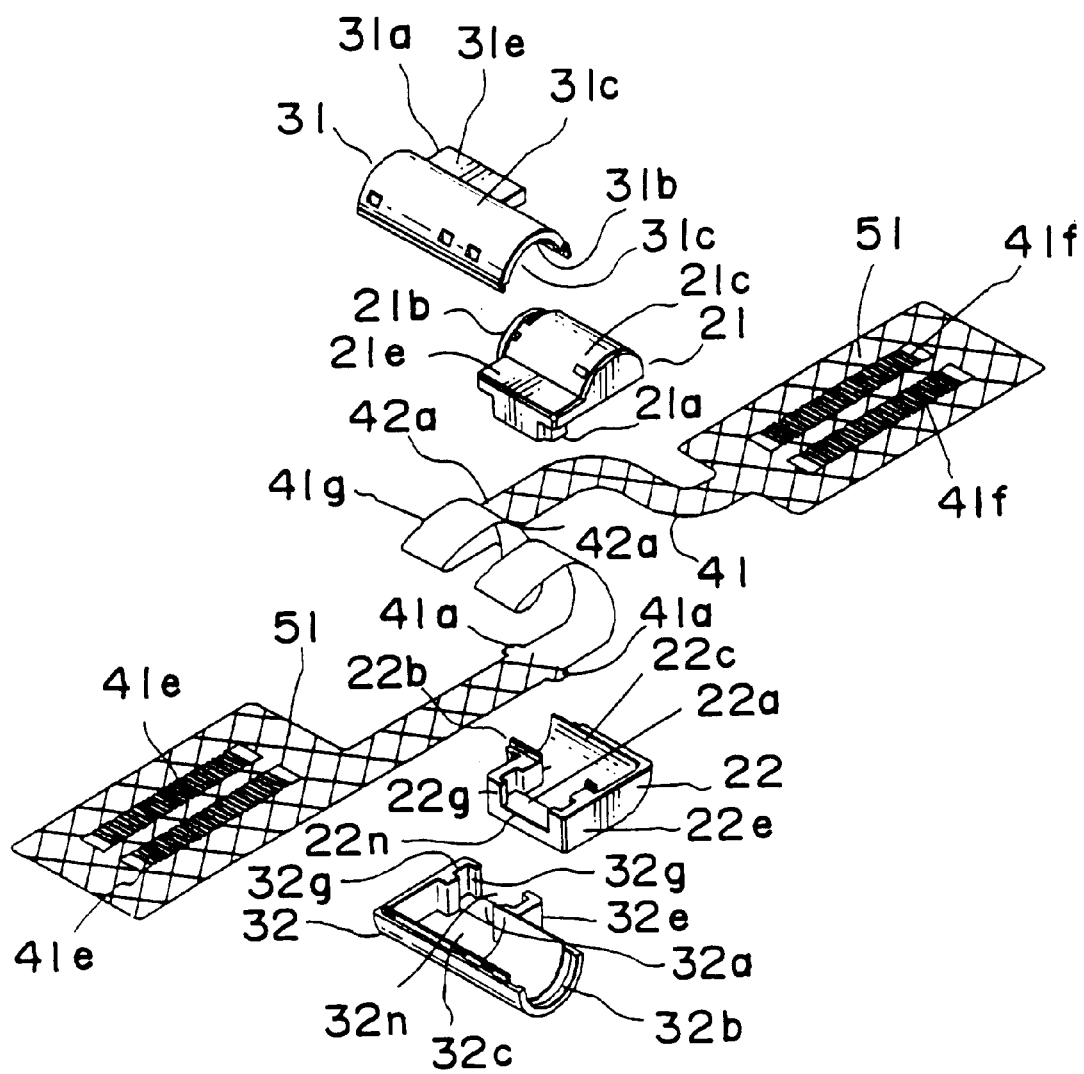
FIG. 19B is an exploded perspective view of the hinge connector of FIG. 19A.
Figure 19C:
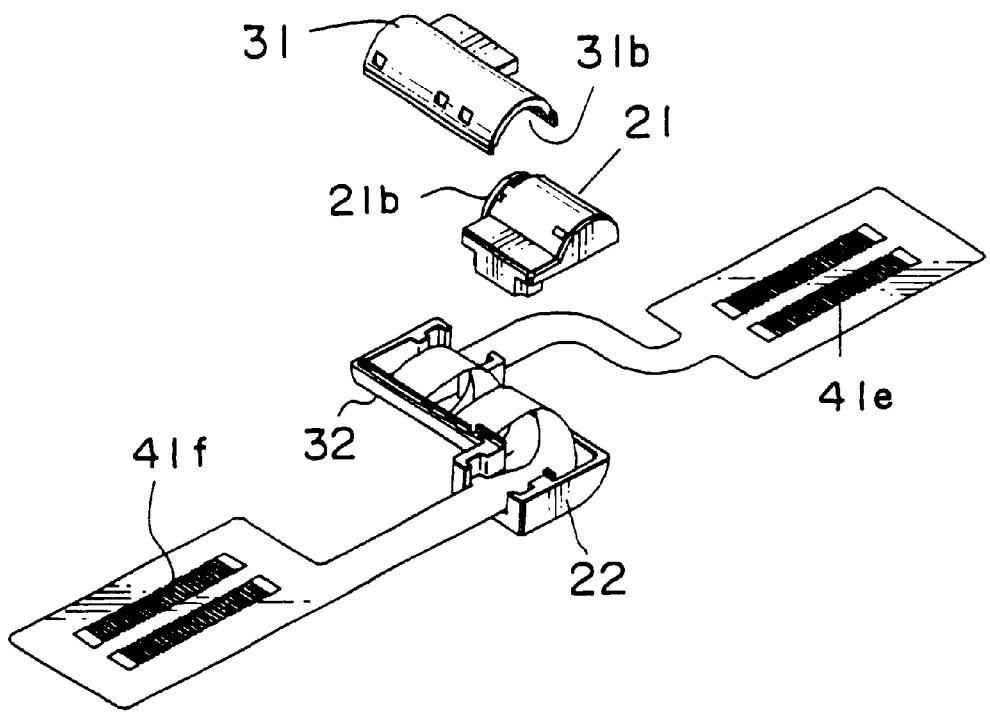
FIG. 19C is an exploded perspective view of the hinge connector of FIG. 19A, in which assembling is partially carried out.
Figure 19D:
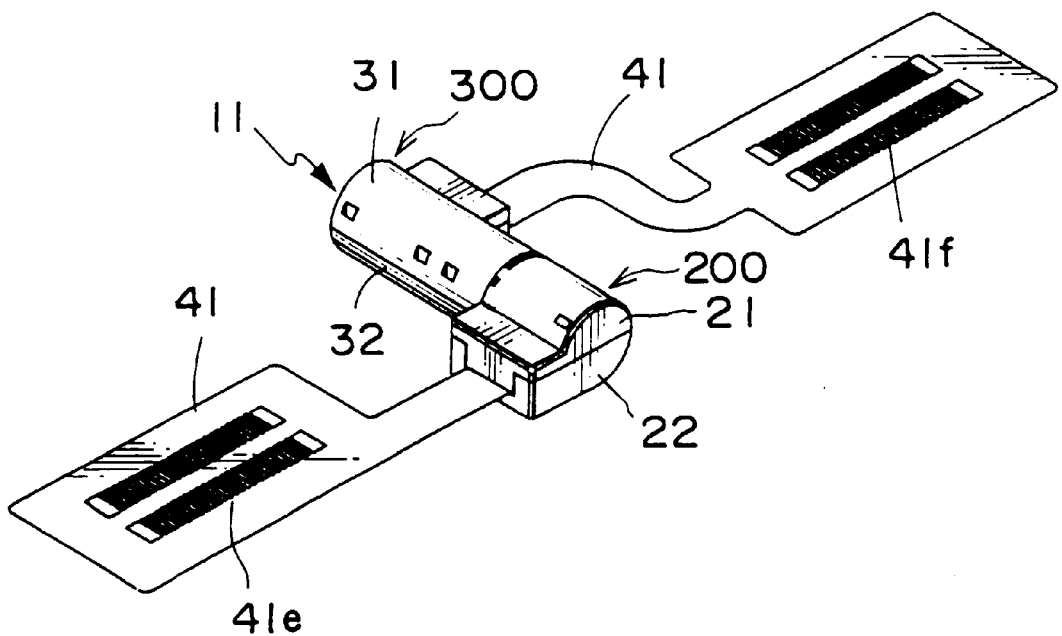
FIG. 19D is a perspective view of the hinge connector of FIG. 19A, in which assembling is completed.

Furthermore, the FPC 41 is provided with shielding layers 51 formed on its opposite surfaces as depicted by mesh patterns in FIG. 19B. The shielding layers 51 are formed in an area from the first engaging portions 41a to the conductive portions 41e and another area from the second engaging portions 42a to the terminal portions 41f. Thus, the FPC 41 is provided with the shielding layers 51 in those areas except the intermediate portion 41g received in the first and the second members 200 and 300. The shielding layers 51 are covered with insulating cover layers (not shown). However, the first and the second engaging portions 41a and 42a alone are exposed without the cover layers.

The first and the second members 200 and 300 are coated with metal plating or conductive painting. The first and the second members 200 and 300 are generally made of a resin material but may be themselves metallic. Thus, the first and the second members 200 and 300 are coated with metal plating or conductive painting or made of a conductive material. Therefore, when the first and the second engaging portions 41a and 42a of the FPC 41 are held by the hinge member 11, the shielding layers 51 of the FPC 41 and the hinge member 11 are electrically connected.

At the first and the second engaging portions 41a and 42a of the FPC 41, the shielding layers 51 are exposed. The shielding layers 51 at these portions are brought into contact with the first and the second members 200 and 300 so that the shielding layers 51 and the first and the second members 200 and 300 are electrically connected. Therefore, the hinge member 11 as a whole serves as the shielding layer 51. Therefore, the intermediate portion 41g of the FPC 41 inside the hinge member 11 need not have the shielding layer 51.

The hinge member 11 is assembled in the following manner. The rotation guide 22b of the split portion 22 is fitted to the rotation guide 32b of the split portion 32. The second engaging portions 42a of the FPC 41 are put on the holding part 32a. Then, the split portions 21 and 22 are coupled to each other and the split portions 31 and 32 are coupled to each other. Thus, the hinge member 11 is completed.

Figure 20:
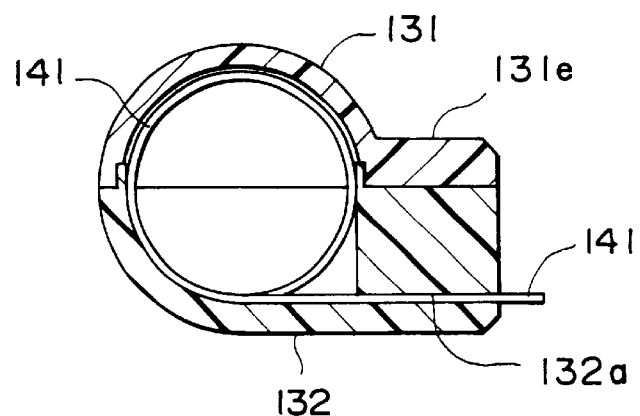
FIG. 20 is a sectional view of the hinge connector of FIG. 19A.
Figure 21:
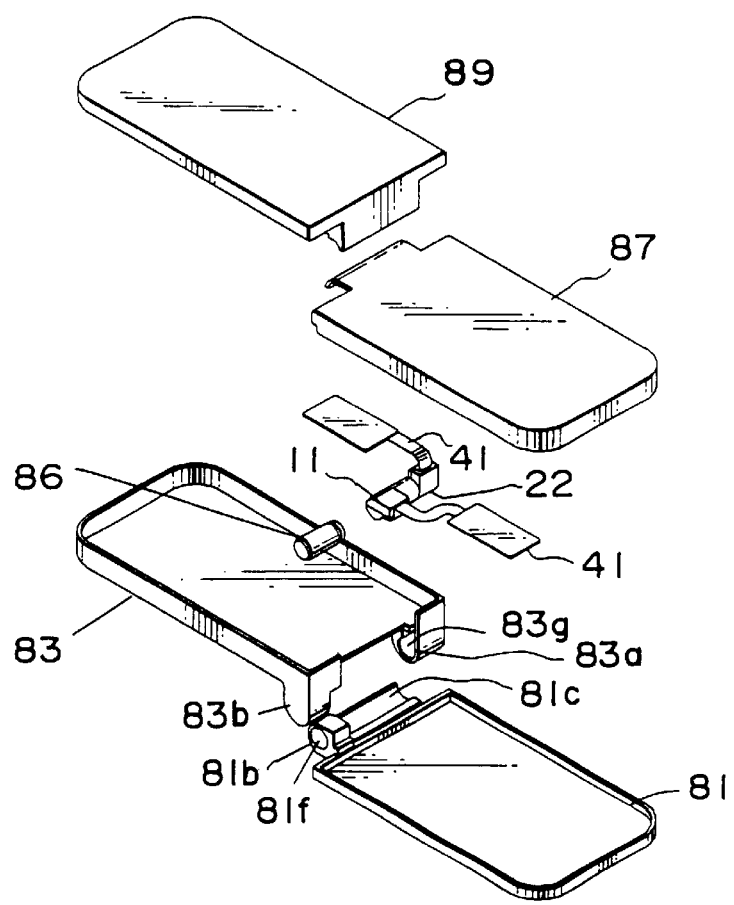
FIGS. 21 through 24 are views for describing a method of assembling the electronic apparatus.
Figure 22:
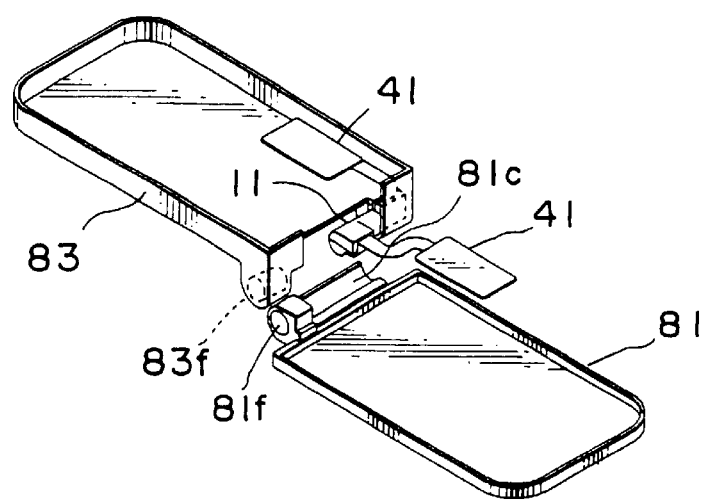
Figure 23:
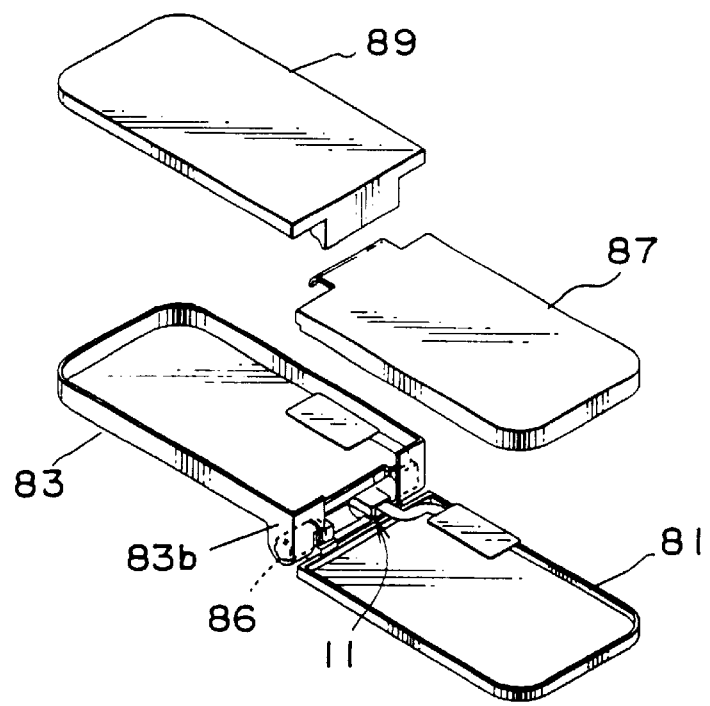

In the hinge member 11, the second holding parts 22a and 32a are formed in the vicinity of a tangent on the inner peripheral surface of the hinge member 11 as illustrated in FIG. 20. With this structure, the rotation diameter of the FPC 41 is increased so that the FPC 41 can be received in a large internal space without being applied with a stress.

Referring to FIGS. 21 through 26, description will be made of an assembling process of the electronic apparatus comprising the hinge member illustrated in FIGS. 19A through 19D and 20. By way of example, the mobile telephone apparatus will be described.

In the mobile telephone apparatus, a first base member 81 mounts an LCD-side board (not shown) and has the hinge portion 81b protruding on one surface thereof at a predetermined interval. A second base member 83 has a damper fixing portion as the hinge portion 83b and a connector receiving portion as the hinge portion 83a which protrude on one surface thereof at a predetermined interval.

The hinge portion 81b is located inside the hinge portion 83b so that the hinge portion 81b is adjacent to the hinge portion 83b. The first base member 81 and the second base member 83 are hinge connected to be rotatable with respect to each other by the use of the hinge portions 81b, 83a, and 83b.

In the split portions 21, 22, 31, and 32 of the first and the second members 200 and 300, the first and the second engaging portions 41a and 42a of the FPC 41 are put on the first and the second holding parts 22a and 32a, respectively. The split portions 21, 22, 31, and 32 of the first and the second members 200 and 300 are coupled together to form the hinge member 11. The hinge portions 81b, 83a, and 83b are aligned along a common center axis.

The first and the second base members 81 and 83 are coupled to each other by fitting a damper member 86 into holes 81f and 83f which are formed in the hinge portions 81b and 83b and aligned along the common center axis. The hinge member 11 is assembled between the first and the second base members 81 and 83. More particularly, the first member 200 of the hinge member 11 is inserted or fitted into a hole 83g formed in the hinge portion 83b of the second base member 83 while the second member 300 of the hinge member is received in a groove 81c formed in the first base member 81. The hinge member 11 is removably held by the first and the second base members 81 and 83.

In the manner described above, the FPC 41 is connected to the LCD-side board mounted on the first base member 81 and to the keyboard-side board mounted on the second base member 83. The first cover member 87 is attached to the first base member 81. The second cover member 89 is attached to the second base member 83.

Figure 24:
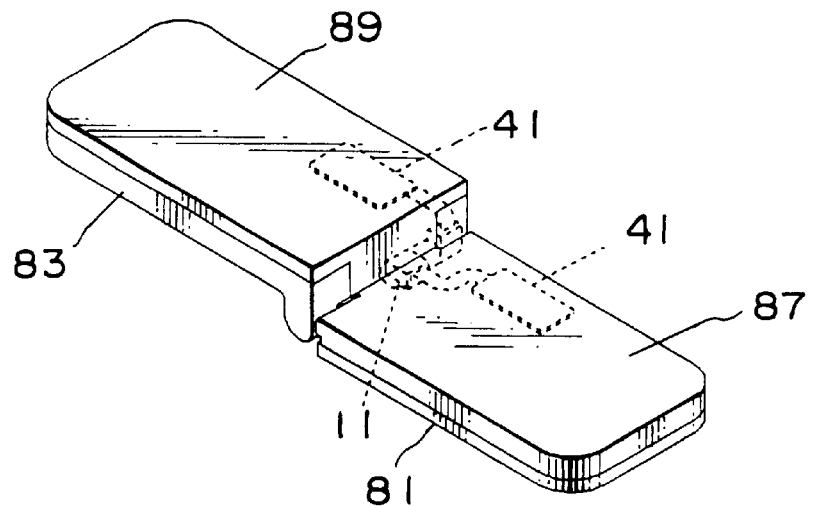

In FIG. 24, the hinge member 11 is assembled in the vicinity of an end portion of the mobile telephone apparatus.

Figure 25:
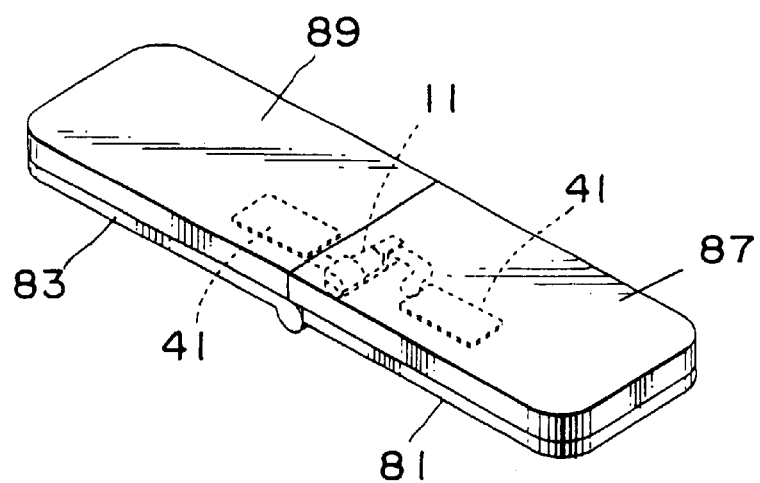

The hinge member 11 may be assembled to a center portion of the mobile telephone apparatus as illustrated in FIGS. 25 and 26. In any event, by simply contacting the hinge member 11 with the shielding layers 51, the shielding layers 51 can be connected to shielding layers (not shown) which are formed on the first and the second base members 81 and 83.

In the electronic apparatus having the folding function, the intermediate portion of the FPC 41 is incorporated into the hinge member 11 hinge-connecting the first and the second base members 81 and 83. Therefore, the electronic apparatus is resistant against repetition of a folding operation, excellent in appearance, easy in assembling, and suppressed in possibility of occurrence of a stress in the hinge portion after assembling.

In the foregoing description, the holding part for holding the FPC is formed in each of all the split portions. Alternatively, such holding part may be formed in only one of the two split portions forming each of the first and the second members 200 and 300. A board and a board connector may be mounted at the both ends of the FPC 41 in correspondence to the types of mating connectors. The FPC may be replaced by a flexible flat cable.

What is claimed is:

1. A hinge connector for use in an electronic apparatus that comprises a first and a second base member for mounting a first and a second electric element, respectively, said hinge connector comprising:
    a hinge element having a receptacle portion and for connecting said first and said second base members so that said first and said second base members are rotatable around a predetermined axis with respect to each other; and
    a flexible conductor element for electrically-connecting said first and said second electric elements to each other, said flexible conductor element having both end portions connected to said first and said second electric elements, respectively, and an intermediate portion located between both said end portions and received in said receptacle portion of said hinge element, said hinge element comprising:
        a first member held by said first base member; and
        a second member held by said second base member and rotatable around said predetermined axis with respect to said first member, said first and said second members having first and second holding parts for holding said flexible conductor element, respectively, said portions to be engaged with said first and said second holding parts, respectively, said hinge connector further comprising shielding layers extending along said flexible conductor element from both said end portions to said first and said second engaging portions, respectively, said first and said second members having conductive portions electrically-connected to said shielding layers, respectively.

2. The hinge connector according to claim 1, wherein said hinge member is removably held by said first and said second base members.

3. The hinge connector according to claim 1, wherein said first and said second members are engaged with each other in a direction parallel to said predetermined axis.

4. The hinge connector according to claim 1, wherein said first and said second members have first and second rotation guides, respectively, said first and said second rotation guides being engaged with each other in a direction parallel to said predetermined axis to guide a relative rotation between said first and said second members.

5. The hinge connector according to claim 1, wherein said flexible conductor element has a part led out from said first member in parallel to said predetermined axis and another pat led out from said second member in a radial direction perpendicular to said predetermined axis.

6. The hinge connector according to claim 1, wherein said conductive portion is formed by metal plating on said first and said second members.

7. The hinge connector according to claim 1, wherein said conductive portion is formed by conductive painting on said first and said second members.

8. The hinge connector according to claim 1, wherein each of said first and said second members is made of a conductive material and serves as said conductive portion.

9. The hinge connector according to claim 1, wherein said shielding layer is covered with an insulating member in an area except those portions corresponding to said first and said second engaging portions.

10. The hinge connector according to claim 1, further comprising:
    a first circuit board mounted on said first base member as said first electric element;
    a second circuit board mounted on said second base member as said second electric element;
    a first connector connected to one of the both ends of said flexible conductor element and removably connected to said first board; and
    a second connector connected to the other of the both ends of said flexible conductor element and removably connected to said second board.

11. The hinge connector according to claim 1, wherein said intermediate portion of the flexible conductor element is wound in a spiral fashion.

12. The hinge connector according to claim 1, wherein said flexible conductor element comprises a plurality of flat cables superposed one another, said flat cables being mechanically connected one another at said first and said second engaging portions.

13. The hinge connector according to claim 12, wherein said intermediate portion of the flexible conductor element is wound in a spiral fashion in which said flat cables have an outer cable and an inner cable placed inner said outer cable, said inner cable being shorter than said outer cable between said first and said second engaging portions.

14. The hinge connector according to claim 1, wherein each of said first and said second members is split into two portions along a plane parallel to said predetermined axis.

15. The hinge connector according to claim 14, wherein each of said first and said second holding parts clamps said flexible conductor element by coupling said two portions.

16. The hinge connector according to claim 14, wherein each of said first and said second holding parts is formed in at least one of said two portions.

17. An electronic apparatus comprising:
    a first base member for mounting a first electric element;
    a second base member for mounting a second electric element;
    a hinge element having a receptacle portion and connecting said first and said second base members so that said first and said second base members are rotatable around a predetermined axis with respect to each other; and
    a flexible conductor element electrically-connecting said first and said second electric elements to each other, said flexible conductor element having both end portions connected to said first and said second electric elements, respectively, and an intermediate portion located between said both end portions and received in said receptacle portion of said hinge element, said hinge element comprising:

a first member held by said first base member; and a second member held by said second base member and rotatable around said predetermined axis with respect to said first member, said first and said second members having first and second holding parts for holding said flexible conductor element, respectively, said flexible conductor element having first and second engaging portions to be engaged with said first and said second holding parts, respectively;

said electronic apparatus further comprising shielding layers extending along said flexible conductor element from said both end portions to said first and said second engaging portions, respectively, said first and said second members having conductive portions electrically connected to said shielding layers, respectively.

18. The electronic apparatus according to claim 17, wherein said hinge member is removably held by said first and said second base members.

19. The electronic apparatus according to claim 17, wherein said first and said second members are engaged with each other in a direction parallel to said predetermined axis.

20. The electronic apparatus according to claim 17, wherein said first and said second members have first and second rotation guides, respectively, said first and said second rotation guides being engaged with each other in a direction parallel to said predetermined axis to guide a relative rotation between said first and said second members.

21. The electronic apparatus according to claim 17, wherein said flexible conductor element has a part led out from said first member in parallel to said predetermined axis and another part led out from said second member in a radial direction perpendicular to said predetermined axis.

22. The electronic apparatus according to claim 17, wherein said conductive portion is formed by metal plating on said first and said second members.

23. The electronic apparatus according to claim 17, wherein said conductive portion is formed by conductive painting on said first and said second members.

24. The electronic apparatus according to claim 17, wherein each of said first and said second members is made of a conductive material and serves as said conductive portion.

25. The electronic apparatus according to claim 17, wherein said shielding layer is covered with an insulating member in an area except those portions corresponding to said first and said second engaging portions.

26. The electronic apparatus according to claim 17, further comprising:

a first circuit board mounted on said first base member as said first electric element;

a second circuit board mounted on said second base member as said second electric element;

a first connector connected to one of the both ends of said flexible conductor element and removably connected to said first board; and a second connector connected to the other of the both ends of said flexible conductor element and removably connected to said second board.

27. The electronic apparatus according to claim 17, wherein said intermediate portion of the flexible conductor element is wound in a spiral fashion.

28. The electronic apparatus according to claim 17, wherein said flexible conductor element comprises a plurality of flat cables superposed one another, said flat cables being mechanically connected one another at said first and said second engaging portions.

29. The electronic apparatus according to claim 28, wherein said intermediate portion of the flexible conductor element is wound in a spiral fashion in which said flat cables have an outer cable and an inner cable placed inner said outer cable, said inner cable being shorter than said outer cable between said first and said second engaging portions.

30. The electronic apparatus according to claim 17, wherein each of said first and said second members is split into two portions along a plane parallel to said predetermined axis.

31. The electronic apparatus according to claim 30, wherein each of said first and said second holding parts clamps said flexible conductor element by coupling said two portions.

32. The electronic apparatus according to claim 30, wherein each of said first and said second holding parts is formed in at least one of said two portions.

* * * * *